United States Patent
Pruett

(10) Patent No.: US 7,633,245 B2
(45) Date of Patent: *Dec. 15, 2009

(54) LIGHT-EMITTING DEVICE DRIVER CIRCUIT

(75) Inventor: Henry Frazier Pruett, Mulino, OR (US)

(73) Assignee: Infocus Corporation, Wilsonville, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/060,019

(22) Filed: Mar. 31, 2008

(65) Prior Publication Data

US 2008/0180043 A1 Jul. 31, 2008

Related U.S. Application Data

(62) Division of application No. 11/069,085, filed on Feb. 28, 2005, now Pat. No. 7,372,883.

(51) Int. Cl.
H05B 37/02 (2006.01)

(52) U.S. Cl. .................. 315/291; 315/224; 315/247; 315/307

(58) Field of Classification Search .......... 315/149, 315/209 R, 224–225, 246–247, 291, 307; 323/280, 282, 285; 363/21.11, 41, 78–79
See application file for complete search history.

(56) References Cited

U.S. PATENT DOCUMENTS

| | | | |
|---|---|---|---|
| 5,287,372 A | 2/1994 | Ortiz | |
| 5,627,460 A | 5/1997 | Bazinet et al. | |
| 5,736,881 A | 4/1998 | Ortiz | |
| 6,118,228 A * | 9/2000 | Pal | 315/307 |
| 6,424,097 B1 | 7/2002 | Pruett et al. | |
| 6,472,828 B1 | 10/2002 | Pruett et al. | |
| 6,476,566 B2 | 11/2002 | Pruett | |
| 6,486,615 B2 * | 11/2002 | Hui et al. | 315/291 |
| 6,520,648 B2 | 2/2003 | Stark et al. | |
| 6,587,490 B2 | 7/2003 | Crawford | |
| 6,624,585 B2 | 9/2003 | Pruett | |
| 6,628,094 B2 | 9/2003 | Pruett | |
| 6,639,365 B2 | 10/2003 | Pruett | |
| 6,853,152 B2 | 2/2005 | Pruett et al. | |
| 7,276,861 B1 * | 10/2007 | Shteynberg et al. | 315/291 |
| 7,459,864 B2 * | 12/2008 | Lys | 315/291 |
| 2003/0057867 A1 | 3/2003 | Pruett | |
| 2003/0057878 A1 | 3/2003 | Pruett | |
| 2004/0183477 A1 * | 9/2004 | Newman et al. | 315/291 |
| 2006/0043953 A1 * | 3/2006 | Xu | 323/282 |

* cited by examiner

*Primary Examiner*—David Hung Vu
*Assistant Examiner*—Tung X Le
(74) *Attorney, Agent, or Firm*—Schwabe Williamson & Wyatt

(57) ABSTRACT

A driver circuit is designed employing a current sensing circuit adapted to sense driving current being supplied to one or more light emitting devices. The driver circuit additionally employs a pulse width modulation circuit adapted to modulate a pulse width of a control signal based at least in part on an output of the current sensing circuit, the control signal being employed to adjust the driving current being supplied to the one or more light emitting devices. The driver circuit additionally employs a buck converter adapted to switch the driving current being supplied to the one or more light emitting devices.

6 Claims, 4 Drawing Sheets

LIGHT-EMITTING DEVICE DRIVER CIRCUIT

RELATED APPLICATIONS

The present patent application is a divisional of and claims priority from U.S. patent application Ser. No. 11/069,085, filed Feb. 28, 2005, entitled "Light Emitting Device Driver Circuit, the contents and disclosure of which are hereby incorporated by reference as if fully set forth herein.

FIELD

Disclosed embodiments of the present invention relate to the field of image projection, and more particularly to the employment of solid state light emitting devices as illumination sources in the field of image projection.

BACKGROUND OF THE INVENTION

A number of projection systems designed to render images, or more specifically, an image frame, by successively turning on and off selected ones of a number of solid state light emitting devices have been proposed. In a projection system, such use of light emitting devices as illumination sources presents different design challenges than the use of a projector lamp as an illumination source. The light emitting devices are typically pulsed on and off in a rapid manner, whereas projector lamps typically remain constantly on throughout operation. Light emitting devices, such as light emitting diodes, typically exhibit a high sensitivity to spurious fluctuations in driving current. This high sensitivity to spurious fluctuations in driving current may result in unintended light output from the light emitting device, resulting in artifacts in the images ultimately rendered by the projection system.

The many design challenges of using light emitting devices in a projection system, only a few of which have been briefly discussed, will require skilled design of light emitting device driver circuits. As the use of light emitting devices, such as light emitting diodes, continues to expand, driver circuits for light emitting devices in other demanding applications will likely make use of driver circuits designed for the demanding application of image projection.

BRIEF DESCRIPTION OF THE DRAWINGS

Embodiments of the present invention will be described by way of the accompanying drawings in which like references denote similar elements, and in which.

DETAILED DESCRIPTION OF EMBODIMENTS OF THE INVENTION

Embodiments of the present invention include but are not limited to circuits for driving light emitting devices, such as light emitting diodes or laser diodes, used as illumination sources in a projection system. The following discussion is primarily presented in the context of light emitting diodes. It is understood that the principles described herein may apply to other light emitting devices.

In the following description, various aspects of embodiments of the present invention will be described. However, it will be apparent to those skilled in the art that other embodiments may be practiced with only some or all of the described aspects. For purposes of explanation, specific numbers, materials and configurations are set forth in order to provide a thorough understanding of the embodiments. However, it will be apparent to one skilled in the art that other embodiments may be practiced without the specific details. In other instances, well-known features are omitted or simplified in order not to obscure the description.

Various operations will be described as multiple discrete operations in turn, in a manner that is most helpful in understanding the embodiments, however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising," "having" and "including" are synonymous, unless the context dictates otherwise.

Figure 1:
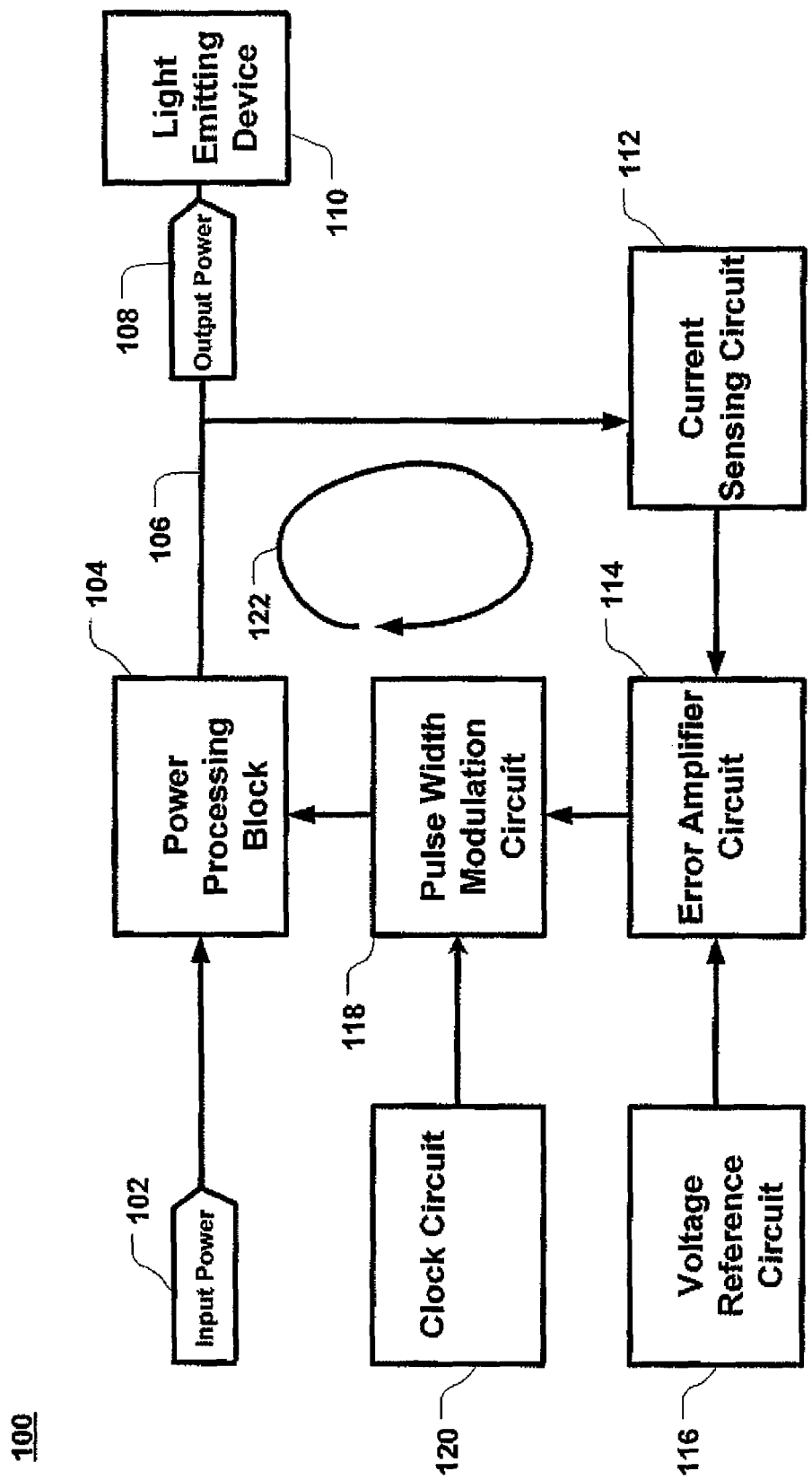
FIG. 1 is a block diagram illustrating a number of functional blocks of a light emitting device driver circuit, in accordance with an embodiment of this invention.

FIG. 1 illustrates a block diagram of a number of functional blocks of a light emitting device driver circuit, in accordance with one embodiment. As illustrated, driver circuit 100 may include power processing block 104. Power processing block 104 may be electrically coupled to light emitting device 110. Power processing block 104 may receive input power 102 and may transmit output power 108 to light emitting device 110. Light emitting device 110 may comprise one or more light emitting devices, such as light emitting diodes. As will be described further in the accompanying detailed embodiments, power processing block 104 may make use of a buck converter to switch the driving current being supplied to the one or more light emitting devices. In various embodiments, power processing block 104 may be capable of driving light emitting device 110 with greater than or equal to approximately one ampere. In various other embodiments, power processing block 104 may be capable of driving light emitting device 110 with less than approximately one ampere.

Power processing block 104 may be electrically coupled to light emitting device 110 via transmission line 106. Current sensing circuit 112 may be electrically coupled to transmission line 106 in such a way, examples of which are detailed in subsequent figures, as to enable measurement of driving current being supplied by power processing block 104 to light emitting device 110. Error amplifier circuit 114 may be electrically coupled to both current sensing circuit 112 and voltage reference circuit 116. Current sensing circuit 112 may supply a first voltage to error amplifier circuit 114, and the first voltage may be related to the driving current being supplied to light emitting device 110. Error amplifier circuit 114 may compare the first voltage with a second voltage supplied by voltage reference circuit 116, and the second voltage may be used to specify the amplitude of the desired driving current being supplied to light emitting device 110.

Error amplifier circuit 114 may function to null the difference between the first voltage and the second voltage by altering the first voltage via feedback loop 122. Feedback loop 122 may include power processing block 104 electrically coupled to current sensing circuit 112, current sensing circuit 112 electrically coupled to error amplifier circuit 114, error amplifier circuit 114 electrically coupled to pulse width modulation circuit 118, and pulse width modulation circuit 118 electrically coupled to power processing block 104. Error amplifier circuit 114 may direct pulse width modulation circuit 118 to change the pulse width of the control signal being supplied to power processing block 104, the pulse width of the control signal having a relationship with the amplitude of the driving current being supplied by power processing block 104 to light emitting device 110. Power processing block 104 may in turn change the amplitude of the driving current being supplied to light emitting device 110 to conform to the desired driving current. Current sensing circuit 112 may in turn sense said driving current, and may supply the first voltage based on said driving current to error amplifier circuit 114. Feedback loop 122 may thus continuously operate to control the driving current being supplied to light emitting device 110.

In various embodiments, the voltage supplied by voltage reference circuit 116 may be fixed, fixing the desired driving current to be supplied to light emitting device 110. In various other embodiments, the voltage supplied by voltage reference circuit 116 may be variable, allowing the specified driving current being supplied to light emitting device 110 to be changed.

Clock circuit 120 may be electrically coupled to pulse width modulation circuit 118, and may transmit a clock signal to pulse width modulation circuit 118. The clock signal frequency may determine the frequency of the signal supplied by pulse width modulation circuit 118 to power processing block 104, which may in turn determine the frequency at which power processing block 104 drives light emitting device 110.

Figure 2:
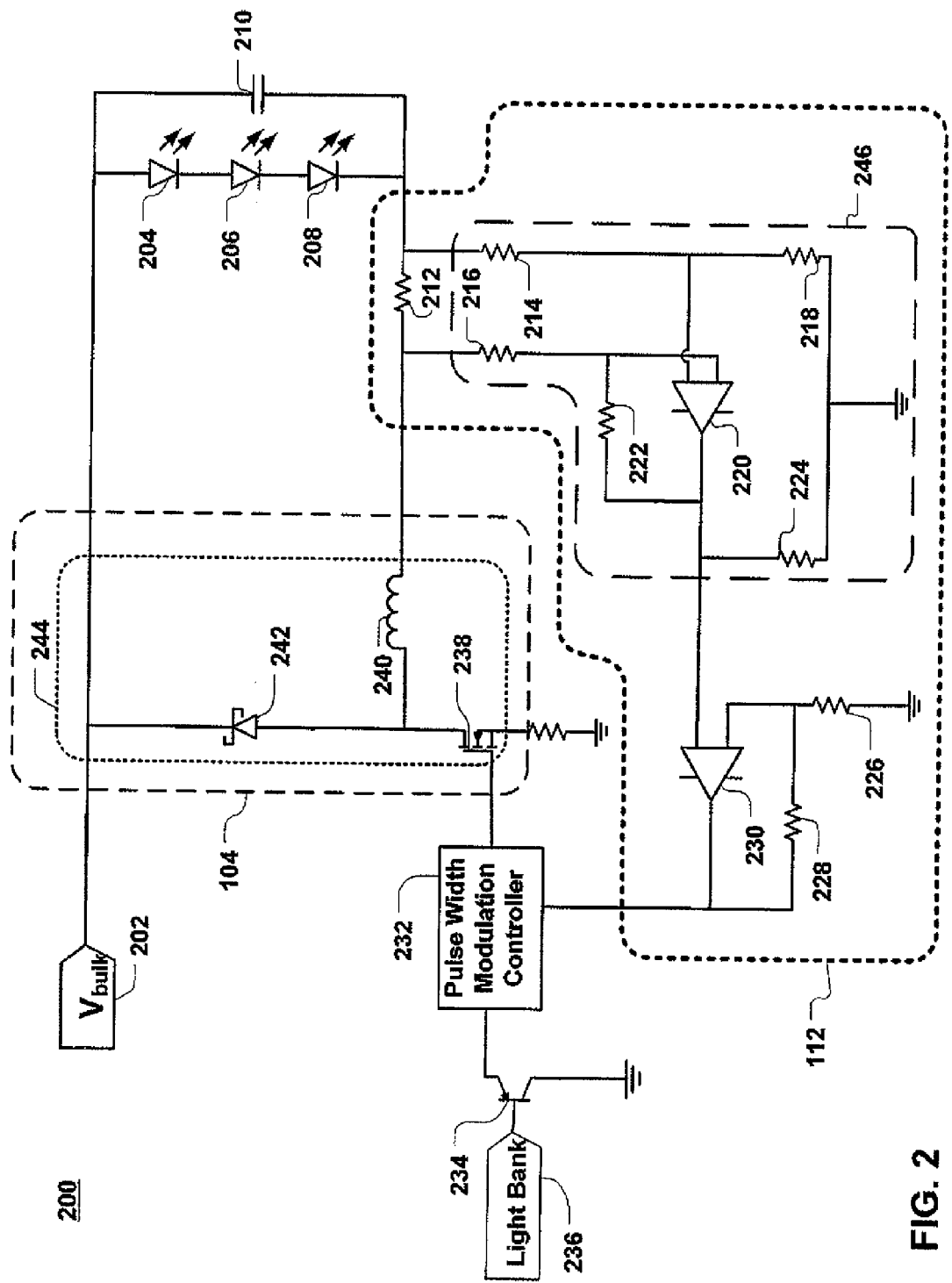
FIG. 2 illustrates some elements of a driver circuit for a light emitting diode, in accordance with an embodiment of this invention.

FIG. 2 illustrates some elements of a light emitting diode driver circuit, in accordance with one embodiment. As illustrated, light emitting diode circuit 200 may receive input power from voltage supply Vbulk 202. In some embodiments, power processing block 104 may include buck converter 244. Buck converter 244 may include Schottky diode 242, MOSFET 238, and inductor 240. While buck converter 244 includes a Schottky diode, various other embodiments may include other types of diodes and may include more than one diode. While buck converter 244 includes a diode, other embodiments may not include a diode. While buck converter 244 includes a MOSFET, other embodiments may include a different mechanism for implementing a switch.

In various embodiments, current sensing circuit 112 may include current sensing resistor 212, and differential amplifier 246. Differential amplifier 246 may include operational amplifier 220, and resistors 214 216 218 222 224, arranged as shown. Values of resistors 214 216 218 222 224 are application dependent, and may vary from implementation to implementation. Differential amplifier 246 may provide some amplification by operational amplifier 220 having a gain greater than one. Current sensing circuit 112 may include a gain stage, which may include operational amplifier 230 and resistors 226 228, arranged as shown. Values of resistors 226 228 are application dependent, and may vary from implementation to implementation.

Pulse width modulation controller 232 may be an integrated circuit including error amplifier circuit 114, voltage reference circuit 116, pulse width modulation circuit 118, and clock circuit 120 of FIG. 1. Pulse width modulation controller 232 may include external components as may be specified by the manufacturer or otherwise known in the art to facilitate its operation.

Bipolar junction transistor 234 may act as a switch controlling timing for the pulsation rate of light emitting diodes 204 206 208. The input signal to bipolar junction transistor 234 may be represented as Light Bank 236, and may be generated by a timing circuit as practiced by those skilled in the art. Capacitor 210 may act to reduce ripple current in the driving current being supplied to light emitting diodes 204 206 208. While the embodiment in FIG. 2 shows three light emitting diodes coupled in series, other embodiments may include a greater or lesser number of light emitting diodes, serially or non-serially coupled together.

Pulse width modulation controller 232 may be electrically coupled to MOSFET 238, and may supply a control signal to MOSFET 238. The pulse width of the control signal supplied to MOSFET 238 may be at least partially modulated to compensate for the ripple sensed in the driving current being supplied to the one or more light emitting devices. In various embodiments, the ripple may include at least approximately fifty kilohertz of oscillation. In various embodiments, the ripple may fall within the range of approximately between twenty kilohertz and one megahertz.

Light emitting diode driver circuit 200 may be capable of turning its one or more light emitting diodes from an on-state to an off-state or from an off-state to an on-state, including settling at the desired amplitude, in the time range of approximately 25 to 100 microseconds. Various other embodiments may perform such switching of a light emitting diode in less than 25 microseconds. Various other embodiments may perform such switching of a light emitting diode in greater than 100 microseconds. Timing for such switching of a light emitting diode from an on-state to an off-state may differ from timing for such switching of a light emitting diode from an off-state to an on-state.

In various embodiments, light emitting diodes 204 206 208 may be monochromatic, and a driving current (e.g., a maximum driving current) supplied to a light emitting diode may be specific to the color output of the light emitting diode. For example, in one embodiment, red light emitting diodes may be driven with a driving current of approximately 10 amperes, blue light emitting diodes may be driven with a driving current of approximately 11 amperes, and green light emitting diodes may be driven with a driving current approximately 17 amperes. In various other embodiments, other driving currents (maximum or otherwise) for various color output light emitting diodes may be used. In various alternative embodiments, a driving current (e.g., a maximum driving current) supplied to a light emitting diode may not be specific to the color output of the light emitting diode.

Figure 3:
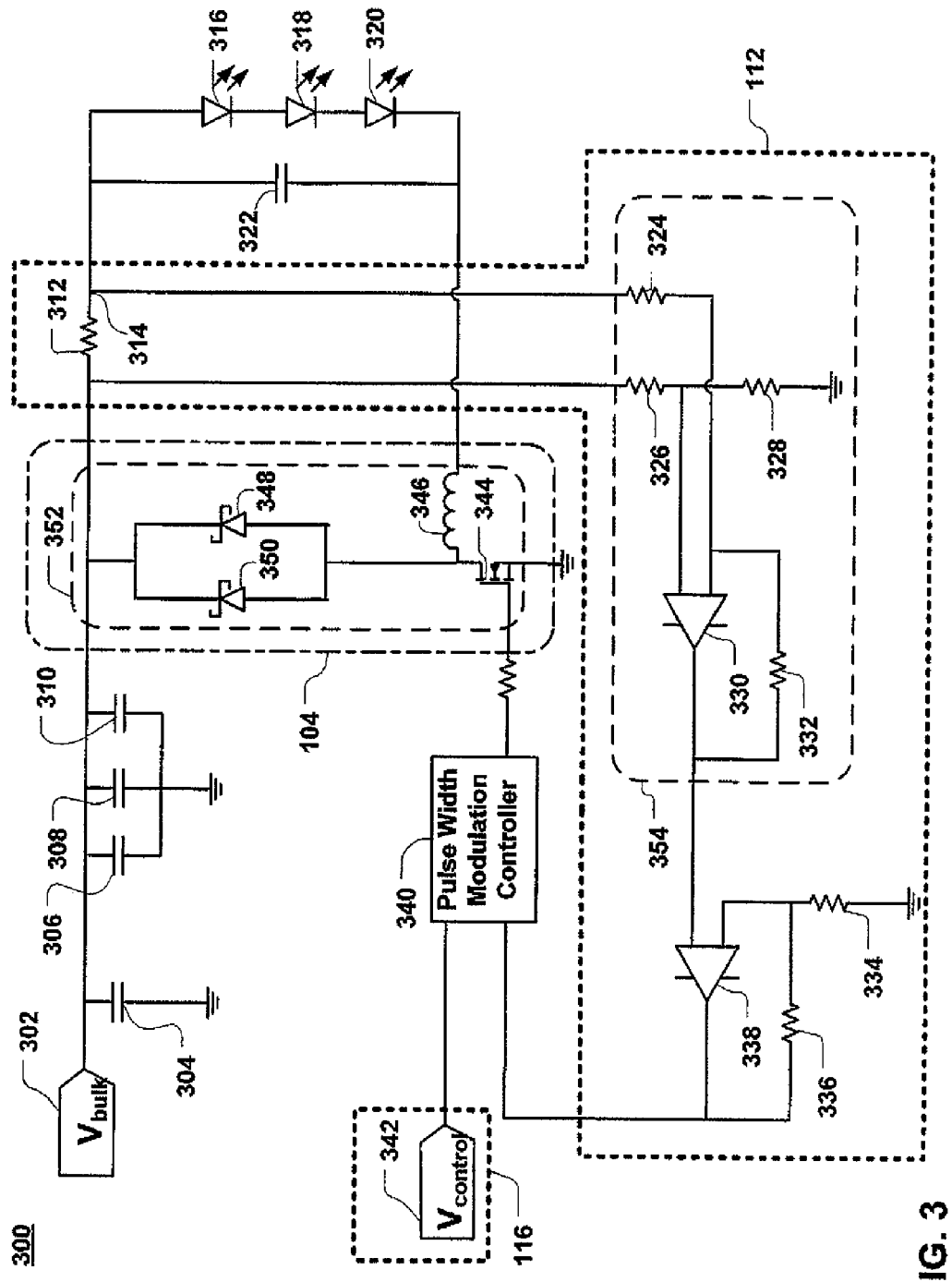
FIG. 3 illustrates some elements of a driver circuit for a light emitting diode, in accordance with an embodiment of this invention.

FIG. 3 illustrates some elements of a light emitting diode driver circuit, in accordance with one embodiment. As illustrated, light emitting diode driver circuit 300 may receive input power from voltage supply Vbulk 302. In some embodiments, power processing block 104 may include buck converter 352. Buck converter 352 may include Schottky diodes 348 350, MOSFET 344, and inductor 346. While buck converter 352 includes Schottky diodes, other embodiments may include other types of diodes and may include a different number of diodes. While buck converter 352 includes diodes, other embodiments may not include any diodes. While buck converter 352 includes a MOSFET, other embodiments may include a different mechanism for implementing a switch. Vbulk 302 may be conditioned with capacitors 304 306 308 310 to remove any alternating current component in Vbulk 302.

In various embodiments, current sensing circuit 112 may include current sensing resistor 312, and differential amplifier 354. Differential amplifier 354 may include operational amplifier 330, and resistors 324 326 328 332, arranged as shown. Values of resistors 324 326 328 332 are application dependent, and may vary from implementation to implementation. Differential amplifier 354 may provide some amplification by operational amplifier 330 having a gain greater than one. Current sensing circuit 112 may include a gain stage, which may include operational amplifier 338 and resistors 334 336, arranged as shown. Values of resistors 334 336 are application dependent, and may vary from implementation to implementation. Pulse width modulation controller 340 may be an integrated circuit including error amplifier circuit 114, pulse width modulation circuit 118, and clock circuit 120 of FIG. 1. Voltage reference circuit 116 in FIG. 3 may output a voltage supplied by a voltage source represented as Vcontrol 342. In various embodiments, Vcontrol 342 may be fixed, while in various other embodiments, Vcontrol 342 may be modifiable. Pulse width modulation controller 340 may include external components as may be specified by the manufacturer or otherwise known in the art to facilitate its operation.

Capacitor 322 may act to reduce ripple current in the driving current being supplied to light emitting diodes 316 318 320. While the embodiment in FIG. 3 shows three light emitting diodes coupled in series, other embodiments may include a greater or lesser number of light emitting diodes, serially or non-serially coupled together.

Pulse width modulation controller 340 may be electrically coupled to MOSFET 344, and may supply a control signal to MOSFET 344. The pulse width of the control signal supplied to MOSFET 344 may be at least partially modulated to compensate for the ripple sensed in the driving current being supplied to the one or more light emitting devices. In various embodiments, the ripple may include at least approximately fifty kilohertz of oscillation. In various embodiments, the ripple may fall within the range of approximately between twenty kilohertz and one megahertz.

Light emitting diode driver circuit 300 may be capable of turning its one or more light emitting diodes from an on-state to an off-state or from an off-state to an on-state, including settling at the desired amplitude, in the time range of approximately 25 to 100 microseconds. Various other embodiments may perform such switching of a light emitting diode in less than 25 microseconds. Various other embodiments may perform such switching of a light emitting diode in greater than 100 microseconds. Timing for such switching of a light emitting diode from an on-state to an off-state may differ from timing for such switching of a light emitting diode from an off-state to an on-state.

In various embodiments, current sensing resistor 312 may be the current sensing portion of current sensing circuit 112. Current sensing resistor 312 may be coupled in series with the one or more light emitting diodes, a node 314 of current sensing resistor 312 being coupled to the anode of the first light emitting diode connected in series with other light emitting diodes. Such an embodiment of current sensing circuit 112 may provide good noise immunity.

In various embodiments, light emitting diodes 316 318 320 may be monochromatic, and a driving current (e.g., a maximum driving current) supplied to a light emitting diode may be specific to the color output of the light emitting diode. For example, in one embodiment, red light emitting diodes may be driven with a driving current of approximately 10 amperes, blue light emitting diodes may be driven with a driving current of approximately 11 amperes, and green light emitting diodes may be driven with a driving current approximately 17 amperes. In various other embodiments, other driving currents (maximum or otherwise) for various color output light emitting diodes may be used. In various alternative embodiments, a driving current (e.g., a maximum driving current) supplied to a light emitting diode may not be specific to the color output of the light emitting diode.

Figure 4:
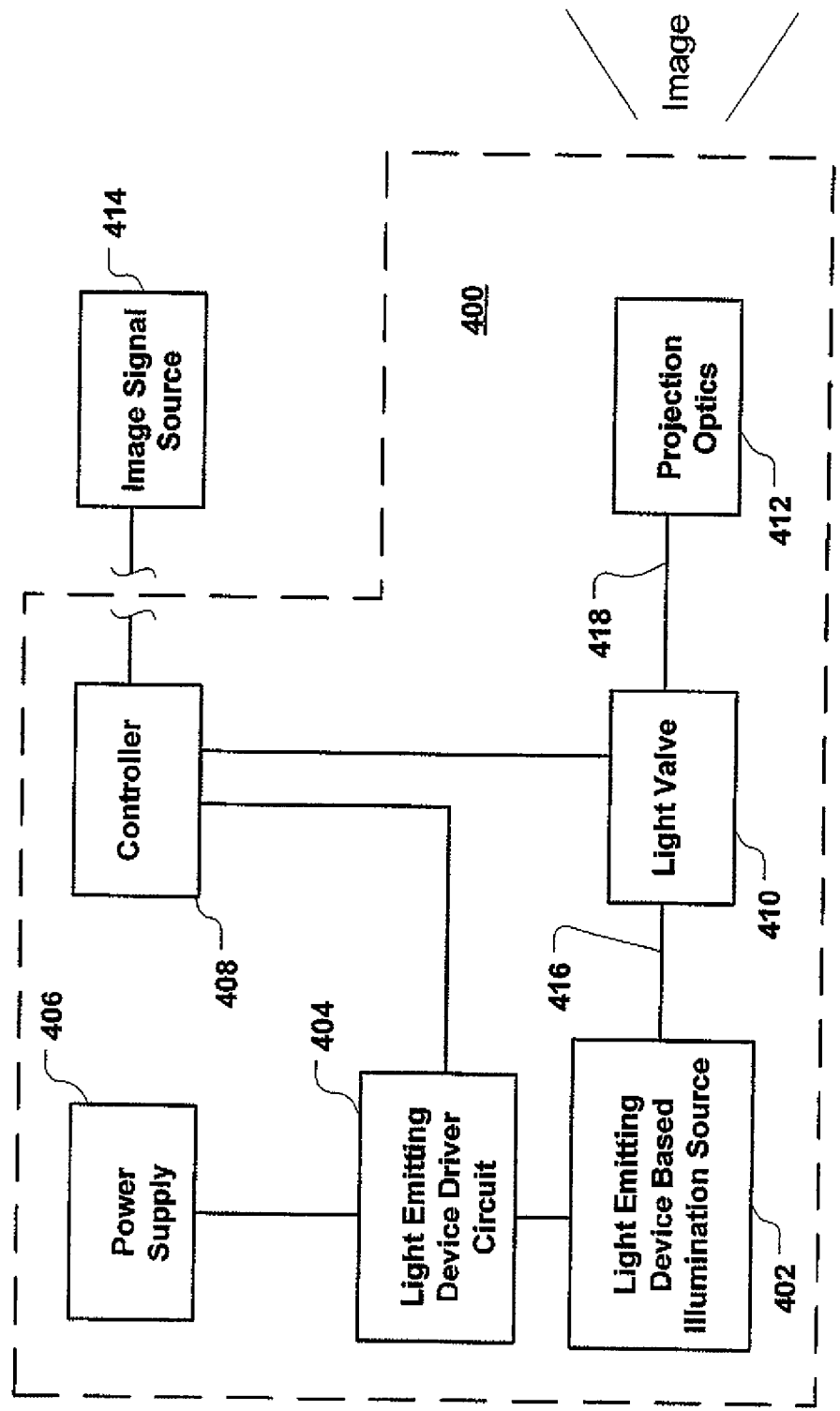
FIG. 4 illustrates a projection system that uses a light emitting device based illumination source driven by a light emitting device driver circuit, in accordance with an embodiment of this invention.

FIG. 4 illustrates projection system 400, which includes light emitting device based illumination source 402 electrically coupled to light emitting device driver circuit 404, in accordance with an embodiment of this invention. Light emitting device driver circuit 404 may be coupled to power supply 406. Light emitting device based illumination source 402 may be optically coupled to light valve 410. Light emitting device based illumination source 402, driven by light emitting device driver circuit 404, may sequentially provide light valve 410 with incident light 416 of a number of constituent colors by pulsing one or more light emitting devices of each constituent color. The constituent colors may be thought of as individual colors that, when combined in the appropriate amounts, create an object color for the image pixel. In one embodiment the constituent colors may include red, green and blue, however, alternative embodiments may additionally or alternatively employ many other colors, including white and other color combinations. In various embodiments, light emitting device driver circuit 404 may be one of the earlier described light emitting diode circuits.

Light valve 410 may be coupled to controller 408. Controller 408 may be adapted to receive image signals from image signal source 414 and to transmit light valve control signals to light valve 410. In various embodiments, image signal source 414 may include, but is not limited to, a personal or laptop computer, a personal data assistant (PDA), a cellular phone, a digital versatile disk (DVD) player, a set-top box, an integrated television tuner, a video camera, or any other source suitable for transmitting image signals to projection system 400. Projection system 400 may be implemented in a variety of different applications including, but not limited to, games, movies, television, advertising and data display.

In various embodiments, image signal source 414 may represent the source of an image signal being transmitted over a communications network to projection system 400. Such a network may include one or more of the following example communications networks: a personal area network (PAN), a local area network (LAN), a wide area network (WAN), a metropolitan area network (MAN), the Internet, etc. In various embodiments, such networks may in whole or in part comprise of landline and wireless links.

Controller 408 may generate image frames from an analog image signal based on a desired frame rate. This process may be omitted if the incoming image signal is a digital signal, as the image frames should already be defined. However, there may be some instances where a frame rate conversion of the source video signal may be desired. Based on the desired object color of each image pixel, controller 408 may generate and route pixel control data for the individual light valve pixels in order to facilitate the modulation of incident light 416 from light emitting device based illumination source 402 into image bearing light 418. Controller 408 may be electrically coupled to light emitting device driver circuit 404 to in order to synchronize pixel control data with light emitting device pulse sequences. Image bearing light 418 may then be passed on to projection optics 412, which may facilitate final imaging. In various embodiments, final imaging may occur on a screen, a display, or some other suitable device. In various embodiments, projection system 400 may be integrated in a projector. In various embodiments, projection system 400 may be integrated in a projection television. In various embodiments, projection system 400 may be integrated in another device that may make use of image or video projection. Projection optics 412 may include a projection lens, an imaging lens, and many other optical components known in the field.

Thus, it can be seen from the above description, circuits for driving light emitting devices being used as illumination sources of a projection system, and projection subsystems and systems so equipped, have been described. While the present invention has been described in terms of the foregoing embodiments, those skilled in the art will recognize that the invention is not limited to the embodiments described. Other embodiments may be practiced with modification and alteration within the spirit and scope of the appended claims. Accordingly, the description is to be regarded as illustrative instead of restrictive.

What is claimed is:

1. A system comprising:
   an illumination source, the illumination source including a light emitting device; and
   a driver circuit coupled to the light emitting device, the driver circuit including:
      a current sensing circuit coupled to the light emitting device, the current sensing circuit adapted to sense driving current being supplied to the light emitting device, the current sensing circuit including an operational amplifier and a collection of resistors configured to sense a ripple in the driving current;
      an error amplifier circuit coupled to the current sensing circuit, and the current sensing circuit is adapted to supply a first voltage to the error amplifier circuit, the first voltage being related to the driving current and the ripple being supplied to the one or more light emitting devices;
      a pulse width modulation circuit coupled to the error amplifier circuit and adapted to modulate a pulse width of a control signal based at least in part on an output of the error amplifier circuit to compensate for the ripple sensed by the current sensing circuit, the control signal to be employed to adjust the driving current being supplied to the light emitting device; and
      a buck converter coupled to the light emitting devices the buck converter adapted to switch the driving current being supplied to the light emitting device by changing amplitude of the driving current based, at least in part, on the control signal.

2. The system of claim 1, further comprising
   a controller, adapted to receive an image signal and to output a light valve control signal representing an image for a frame; and
   a light valve, coupled to the controller and optically coupled to the illumination source, the light valve being adapted to modulate an incident light produced by the illumination source into image bearing light based on the light valve control signal.

3. The system of claim 2, further comprising
   projection optics, optically coupled to the light valve to receive the image bearing light and to project the image.

4. The system of claim 3, wherein the controller is further adapted to receive and project a series of images as video.

5. The system of claim 1, further comprising
   an image signal source, coupled to the controller, to output the image signal.

6. The system of claim 1, wherein the system comprises one of a group consisting of a projector and a projection television.

* * * * *